United States Patent
Akiyama et al.

(10) Patent No.: US 7,738,794 B2
(45) Date of Patent: Jun. 15, 2010

(54) OPTICAL TRANSMITTER

(75) Inventors: Suguru Akiyama, Kawasaki (JP); Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 942 days.

(21) Appl. No.: 11/364,054

(22) Filed: Mar. 1, 2006

(65) Prior Publication Data
US 2007/0110453 A1    May 17, 2007

(30) Foreign Application Priority Data
Nov. 15, 2005    (JP)    ............................. 2005-330372

(51) Int. Cl.
*H04B 10/04*    (2006.01)
(52) U.S. Cl. .................... 398/182; 398/201; 398/85
(58) Field of Classification Search ................ 398/182, 398/183, 186, 192, 194, 195, 85, 193, 199, 398/200, 201, 87, 149
See application file for complete search history.

(56) References Cited

U.S. PATENT DOCUMENTS

| | | | | |
|---|---|---|---|---|
| 5,373,383 | A * | 12/1994 | LaGasse | 398/26 |
| 6,393,185 | B1 | 5/2002 | Deacon | 385/50 |
| 6,850,713 | B2 | 2/2005 | Kikuchi et al. | 398/201 |
| 6,931,215 | B1 * | 8/2005 | Fukuda et al. | 398/201 |
| 7,376,356 | B2 * | 5/2008 | Madsen | 398/183 |
| 2002/0131470 | A1 * | 9/2002 | Eggleton et al. | 372/102 |
| 2002/0171900 | A1 * | 11/2002 | Ono et al. | 359/181 |
| 2003/0095736 | A1 * | 5/2003 | Kish et al. | 385/14 |
| 2003/0128984 | A1 * | 7/2003 | Oberg et al. | 398/83 |

FOREIGN PATENT DOCUMENTS

| | | |
|---|---|---|
| JP | 62-100706 | 5/1987 |
| JP | 2-198235 | 8/1990 |

(Continued)

OTHER PUBLICATIONS

D. Mahgerefteh, et al.; "Error-free 250 km transmission in standard fibre using compact 10 Gbit/s chirp-managed directly modulated lasers (CML) at 1550 nm;" *Electronics Letters*; vol. 41; No. 9; Apr. 28, 2005 (2 Sheets.)Discussed in the specification.

(Continued)

*Primary Examiner*—M. R. Sedighian
(74) *Attorney, Agent, or Firm*—Kratz, Quintos & Hanson, LLP

(57) ABSTRACT

In an optical transmitter comprising a directly modulated laser and a wavelength filter provided on a post-stage of the directly modulated laser, the wavelength filter has a modulated light input port for inputting modulated light output from the directly modulated laser, a filter transmitted light output port for outputting light having a wavelength included in a filter transmission band among the modulated light as filter transmitted light, and a filter cutoff light output port provided separately from the modulated light input port and the filter transmitted light output port and outputting light having a wavelength included in a filter cutoff band among the modulated light as filter cutoff light, and the peak of the filter transmission band is set on a shorter-wave side from the peak of the spectrum of modulated light output from the directly modulated laser.

8 Claims, 11 Drawing Sheets

FOREIGN PATENT DOCUMENTS

| | | | |
|---|---|---|---|
| JP | 04343283 | * | 11/1992 |
| JP | 2002-169131 | | 6/2002 |
| JP | 2002-258083 | | 9/2002 |
| JP | 2003-513328 | | 4/2003 |
| JP | 2003-298525 | | 10/2003 |
| JP | 2004-157192 | | 6/2004 |

OTHER PUBLICATIONS

European Search Report dated Feb. 23, 2007.

Japanese Office Action issued in corresponding Japanese patent application No. 2005-330372 dated Feb. 24, 2009—Notice of Reasons of Rejection with English translation.

* cited by examiner

EXTINCTION RATIO 2dB

EXTINCTION RATIO 10dB

OPTICAL TRANSMITTER

CROSS REFERENCE TO RELATED APPLICATIONS

This application is based on and hereby claims priority to Japanese Application No. 2005-330372 filed on Nov. 15, 2005 in Japan, the contents of which are hereby incorporated by reference.

BACKGROUND OF THE INVENTION (1) Field of the Invention

The present invention relates to an optical transmitter used in an optical communication system, and for example, to an optical transmitter provided with a directly modulated laser.

(2) Description of Related Art

An optical transmitter module provided with a directly modulated laser (DML) is simple in comparison with one using an external modulator and has advantages that the cost is low, the space is saved, and the consumed power is small.

However, the DML has large wavelength chirping in comparison with one using an external modulator and has a disadvantage that the transmission distance is reduced as a result.

Here, the wavelength chirping means wavelength fluctuations that occur accompanying intensity modulation of light. In order to perform long distance transmission, it is necessary to suppress the wavelength chirping low.

Recently, there is discussion about an attempt to suppress the wavelength chirping low in order to perform longer distance transmission using the DML by optimizing drive methods and performing signal spectrum processing by use of a wavelength filter (for example, refer to D. Mahgerefteh et al. "Error-free 250 km transmission in standard fibre using compact 10 Gbit/s chirp-managed directly modulated lasers (CML) at 1550 nm" ELECTRONICS LETTERS 28 Apr. 2005 Vol. 41 No. 9).

In this specification, such a DML is particularly referred to as a low chirp directly modulated laser or low-chirp DML.

Here, FIG. 18 shows a configuration of a low chirp directly modulated laser in the prior art.

As shown in FIG. 18, the low chirp directly modulated laser in the prior art uses a single oscillation mode DFB laser 100 as a directly modulated semiconductor laser and the laser light output from the DFB laser 100 (DFB laser output light; modulated light) is caused to be inputted to a wavelength filter 103 via a coupling lens 101 and an isolator 102.

In this case, part of filter input light inputted to the wavelength filter 103 passes through the wavelength filter 103 and is output as filter transmitted light (module output light) as a result. On the other hand, part of the filter input light is cut off by the wavelength filter 103 and returns to the isolator 102 side as filter cutoff light.

Additionally, the isolator 102 is arranged in order to prevent the cutoff light cut off by the wavelength filter 103 from entering the DFB laser 100 as returned light.

The drive conditions of the DFB laser 100 in the low chirp directly modulated laser, the filter conditions of the wavelength filter 103, etc., will be explained in detail below with the principles of the low chirp directly modulated laser. Here, there is exemplified the case where the low chirp directly modulated laser is driven under the conditions that the operation wavelength is 1.55 μm and the modulation rate is 10 Gb/s.

By comparing with a normal DML, the DFB laser 100 in the low chirp directly modulated laser is driven under the conditions that the average light output is increased by increasing the value of the direct current bias and the extinction ratio is reduced by reducing the drive current amplitude value. Normally, the extinction ratio is set to about 2 dB in the low chirp directly modulated laser.

Here, FIG. 19 schematically shows the light intensity waveform of laser light output from the DFB laser 100 when the DFB laser 100 is driven under such drive conditions.

On the basis of the properties of the DFB laser 100, the wavelength of output light from the DFB laser 100 generates time fluctuation as shown in FIG. 20 in accordance with the light intensity waveform shown in FIG. 19 in the case of such high average light output and low extinction ratio drive (this is referred to as a wavelength chirp waveform). In other words, the laser light (output light) output from the DFB laser 100 changes in wavelength approximately in proportion to the light intensity waveform (the proportion coefficient is a negative value).

For example, when the light intensity of laser light output from the DFB laser 100 is high, that is, in the case of the ON level, the wavelength of the laser output light becomes shorter (the frequency becomes higher) and conversely, when the light intensity of laser light output from the DFB laser 100 is low, that is, in the case of the OFF level, the wavelength of the laser output light becomes longer (the frequency becomes lower). Normally, in a low chirp directly modulated laser, the drive current amplitude value and the direct current bias current value are set such that the difference in wavelength of the laser output light between the ON level and the OFF level becomes about 5 GHz in terms of the frequency.

Additionally, in the case of the normal DML (not the low chirp directly modulated laser type), not only the change in wavelength in proportion to the light intensity waveform but also a large wavelength fluctuation component in proportion to the time derivative thereof are produced in the wavelength chirp (fluctuation) waveform in FIG. 20.

In contrast to this, in the case of the low chirp directly modulated laser, the wavelength fluctuation component in proportion to the time derivative of such a light intensity waveform is suppressed low by being driven under the conditions that the average light output is increased and the extinction ratio is suppressed low, which results in making a signal more suitable for optical fiber transmission.

By the way, the spectrum of the output light from the DFB laser in the low chirp directly modulated laser is such one as shown by the solid line A in FIG. 21.

Additionally, in the spectrum shown by the solid line A in FIG. 21, the short wave component corresponds to the ON level component of the output light from the DFB laser and the long wave component corresponds to the OFF level component of the output light from the DFB laser, respectively.

In the low chirp directly modulated laser, signal spectrum processing is performed for the output light spectrum of such a DFB laser by use of a wavelength filter having a wavelength filter function as shown by the solid line B in FIG. 21. In other words, filtering processing is performed such that the short wave component corresponding to the ON level of the light intensity waveform is transmitted and the long wave component corresponding to the OFF level is cut off.

With such filtering processing, the signal spectrum of the wavelength filter transmitted light after passing through the filter and the light intensity waveform of the wavelength filter transmitted light become those shown in FIGS. 22 and 23, respectively.

In other words, as shown in FIG. 22, the signal light of the OFF level component is cut off relatively more than the signal light of the ON level component, therefore, as shown in FIG. 23, the light intensity waveform of the wavelength filter transmitted light after passing through the filter has as large a extinction ratio as about 10 dB in comparison with the light intensity waveform of the output light from the DFB laser shown in FIG. 19. Further, as shown in FIG. 22, the width of the signal spectrum becomes small because the OFF level component has been cut off.

As described above, in the low chirp directly modulated laser, the spectrum width of the signal light is reduced using the wavelength filter so that it becomes more unlikely to receive the influence of the group velocity dispersion of optical fiber transmission, and long-distance transmission is made possible, as a result. Further, since the extinction ratio of the light intensity waveform to be output finally via the wavelength filter is large, it is possible to use the low chirp directly modulated laser for normal and simple intensity modulation on off keying (IM-OOK).

SUMMARY OF THE INVENTION

By the way, the low chirp directly modulated laser shown in FIG. 18 is capable of longer distance transmission than that by a general DML, however, there arises a problem that the configuration of an optical module is complex and the cost is increased.

In comparison with a general DML, the low chirp directly modulated laser requires an excessive part, that is, the wavelength filter, and tasks of arranging the DFB laser, the isolator, and the wavelength filter in this order, of performing optical axis alignment using, for example, a lens, and of performing optical coupling. Because of this, the assembling cost (the production cost) when manufacturing a module is increased. Further, it also requires a wavelength filter and a lens for performing optical coupling, and a space for accommodating them, therefore, there arises a problem that the total size of a module becomes large.

In order to solve these problems, the low chirp directly modulated laser is demanded to reduce the total production cost and the module size by integrating these parts to form a single device.

However, in this case, since an isolator capable of being integrated with a DFB laser does not exist, the above cannot be realized.

On the other hand, an isolator is indispensable for a general DML in order to prevent cutoff light from a wavelength filter from returning to a DFB laser to adversely affect the operation of the DFB laser.

Because of this, it is desired to realize a low chirp directly modulated laser in which a DFB laser and a wavelength filter are integrated to form a single device while preventing cutoff light from the wavelength filter from returning to the DFB laser to adversely affect the operation of the DFB laser.

The present invention has been developed in considering such problems and its object is to provide an optical transmitter capable of long distance transmission, like a low chirp directly modulated laser according to a prior art, and capable of simplifying its configuration and reducing the production cost and the size in comparison with the low chirp directly modulated laser according to the prior art.

Therefore, an optical transmitter according to the present invention includes a directly modulated laser and a wavelength filter provided on a post-stage of the directly modulated laser, wherein the wavelength filter has a modulated light input port connected to the directly modulated laser and inputting modulated light output from the directly modulated laser, a filter transmitted light output port connected to an optical coupling system and outputting light having a wavelength included in a filter transmission band among the modulated light as filter transmitted light, and a filter cutoff light output port provided separately from the modulated light input port and the filter transmitted light output port and outputting light having a wavelength included in a filter cutoff band among the modulated light as filter cutoff light, and wherein the peak of the filter transmission band is set on a shorter-wave side from the peak of the spectrum of modulated light output from the directly modulated laser.

Therefore, according to the optical transmitter of the present invention, long distance transmission is possible, like a low chirp directly modulated laser according to the prior art, and there are advantages that the configuration can be simplified, the production cost can be reduced, and the size can be reduced in comparison with the low chirp directly modulated laser according to the prior art.

DESCRIPTION OF THE PREFERRED EMBODIMENTS

The optical transmitter according to the embodiments of the present invention will be described below using the drawings.

First Embodiment

First, an optical transmitter according to a first embodiment will be described with reference to FIGS. 1 to 9.

Figure 1:
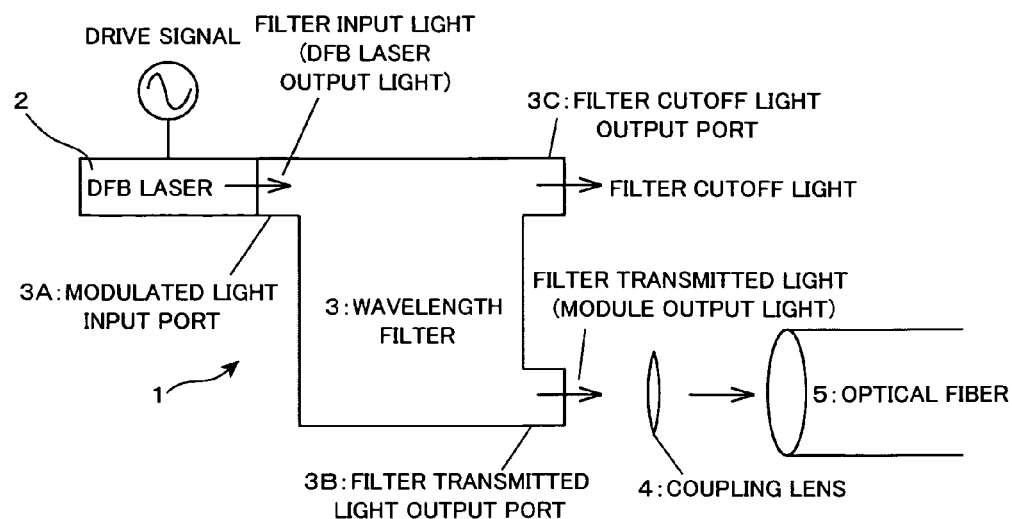
FIG. 1 is a conceptual diagram of an optical transmitter according to a first embodiment of the present invention.

The optical transmitter according to the first embodiment is, for example, as shown in a conceptual diagram in FIG. 1, a low chirp directly modulated laser 1 as an optical transmitter module, including a DFB laser 2 as a single mode oscillation directly modulated laser and a wavelength filter 3 provided on a post-stage of the DFB laser 2.

Here, the DFB laser 2 is designed so as to be driven under the conditions of a high average light output (large direct current bias) and a low extinction ratio (small drive current amplitude), like a low chirp directly modulated laser according to the prior art.

Further, the filter properties of the wavelength filter 3 are set such that signal light (modulated light) directly modulated in and output from the DFB laser 2 is inputted thereto via a modulated light input port 3A, wherein light having a wavelength corresponding to the ON level (light intensity is high) of the modulated light is transmitted and output from a filter transmitted light output port 3B, and on the other hand, light having a wavelength corresponding to the OFF level (light intensity is low) is cut off and output from a filter cutoff light output port 3C.

In other words, the filter properties of the wavelength filter 3 are set such that the light transmittance of a wavelength corresponding to the OFF level is relatively small in comparison with the light transmittance of a wavelength corresponding to the ON level among the modulated light from the DFB laser 2. Due to this, like the low chirp directly modulated laser according to the prior art, the optical transmitter module 1 is capable of longer distance transmission in comparison with a simple DML by using, for example, a simple transmission system of IM-OOK.

Particularly, in the present embodiment, the wavelength filter 3 is provided with the three ports 3A, 3B, and 3C spatially separated and individually arranged as shown in FIG. 1. In other words, the wavelength filter 3 is provided with the modulated light input port 3A, the filter transmitted light output port 3B, and the filter cutoff light output port 3C.

The modulated light input port 3A of the ports is one connected to the DFB laser 2 for inputting modulated light (DFB laser output light) output from the DFB laser 2 as filter input light.

Moreover, the filter transmitted light output port 3B is one for outputting light having a wavelength included in the filter transmission band among the modulated light as filter transmitted light. The filter transmitted light output from the filter transmitted light output port 3B is coupled to an optical fiber 5 via, for example, an optical coupling system such as a coupling lens 4. Thus, the filter transmitted light output from the filter transmitted light output port 3B is taken out as output light from the optical transmitter module 1. Because of this, filter transmitted light is also referred to as module output light.

Further, the filter cutoff light output port 3C is one for outputting light having a wavelength included in the filter cutoff band among the modulated light as filter cutoff light.

As described above, in the present embodiment, the output light from the DFB laser 2 is directly inputted to the modulated light input port 3A of the wavelength filter 3 and the light inputted to the wavelength filter 3 is output from the filter transmitted light output port 3B or the filter cutoff light output port 3C, therefore, even if an isolator is not provided between the DFB laser 2 and the wavelength filter 3, it is unlikely that the cutoff light cut off by the wavelength filter 3 returns to the DFB laser 2 via the input port 3A. Therefore, it is also unlikely that the DFB laser 2 is adversely affected (the laser properties are adversely affected) by the returned light from the wavelength filter 3.

Figure 2:
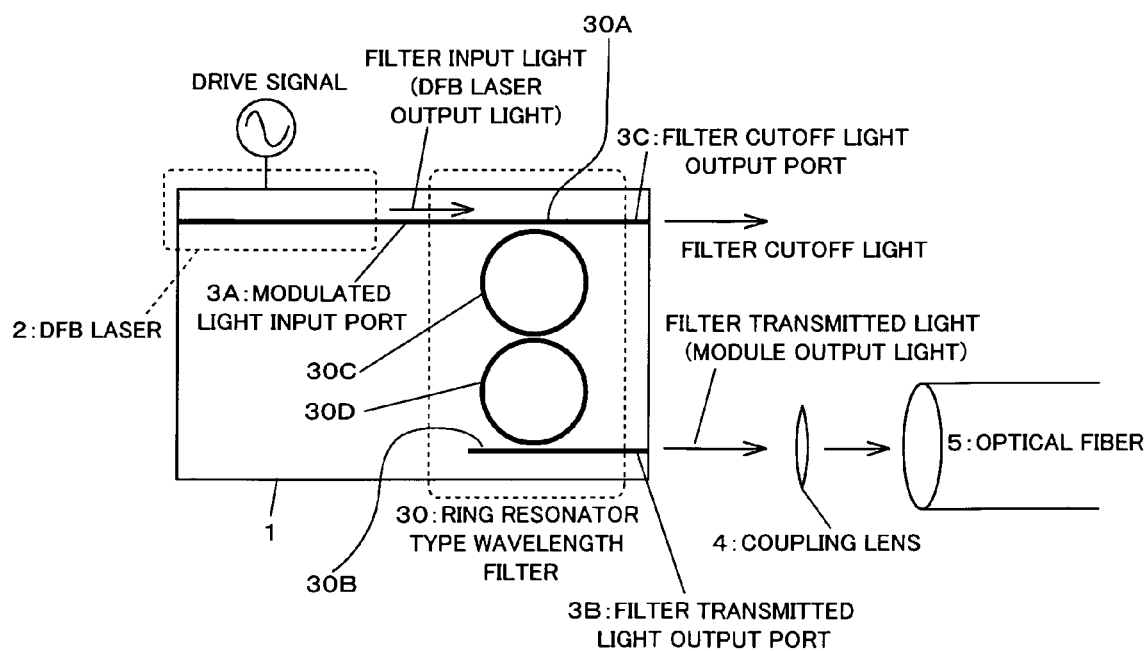
FIG. 2 is a schematic diagram showing a configuration of the optical transmitter according to the first embodiment of the present invention.

In the present embodiment, as shown in FIG. 2, the optical transmitter module 1 is configured as an integrated device (an integrally formed device) in which the DFB laser 2 provided with an active optical waveguide and a waveguide type wavelength filter 30 are integrally formed on the same substrate.

Because of this, tasks such as alignment of optical axis using, for example, a lens etc. and optical coupling are no longer necessary among the DFB laser, the isolator, and the wavelength filter. As a result, the production cost and the man-hours can be reduced. Further, by the integration of devices, the total size of an optical module can be reduced.

Here, as the wavelength filter 30, as shown in FIG. 2, a ring resonator type wavelength filter is used, which includes a first linear passive optical waveguide 30A, a second linear passive optical waveguide 30B, a first ring-shaped passive optical waveguide 30C, and a second ring-shaped passive optical waveguide 30D.

In the first linear passive optical waveguide 30A of above, one end thereof is connected to the active optical waveguide of the DFB laser 1 and the other end extends to the device end surface. In other words, one end of the first linear optical waveguide 30A constitutes the modulated light input port 3A of the wavelength filter 30 and the other end constitutes the filter cutoff light output port 3C.

The second linear optical waveguide 30B is provided on the opposite side of the first linear optical waveguide 30A in parallel to the first linear optical waveguide 30A, sandwiching the first and second ring-shaped passive optical waveguides 30C and 30D in between. The second linear optical waveguide 30B extends to the device end surface and its end constitutes the filter transmitted light output port 3B.

Incidentally, the configuration of the first and second ring-shaped passive optical waveguides 30C and 30D will be described later.

Additionally, to both of the device end surfaces is applied anti-reflective coating.

A stacking structure of the optical transmitter module (low chirp directly modulated laser) 1 as an integrally formed device according to the present embodiment will be described below with reference to FIGS. 3 and 4.

Figure 3:
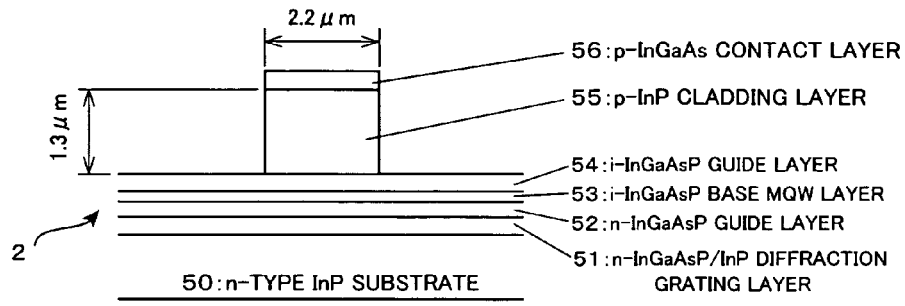
FIG. 3 is a schematic sectional view showing a configuration of a DFB laser constituting the optical transmitter according to the first embodiment of the present invention.

Here, FIG. 3 shows a schematic sectional view of an optical waveguide in the DFB laser 2. FIG. 4 shows a schematic sectional view of an optical waveguide in the ring resonator type wavelength filter 30.

Figure 4:
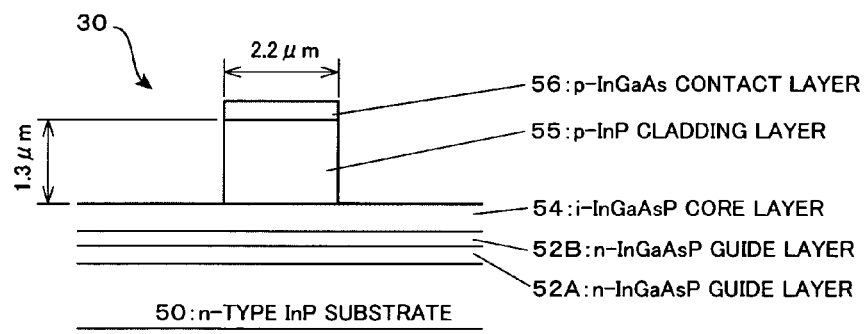
FIG. 4 is a schematic sectional view of a wavelength filter constituting the optical transmitter according to the first embodiment of the present invention.

In the present embodiment, as shown in FIGS. 3 and 4, the optical transmitter module 1 has a structure in which the DFB laser 2 and the ring resonator type wavelength filter 30 are integrated on an n-type InP substrate 50.

Here, both the DFB laser 2 and the ring resonator type wavelength filter 30 are configured so as to have a ridge type optical waveguide structure.

First, as shown in FIG. 3, the DFB laser 2 has a structure in which an n-InGaAsP/InP diffraction grating layer 51, an n-InGaAsP guide layer 52, an i (undoped)-InGaAsP related multiple quantum well (MQW) layer 53, an i-InGaAsP guide layer 54, a p-InP cladding layer 55, and a p-InGaAs contact layer 56 are sequentially stacked on the n-type InP substrate 50.

Here, the diffraction grating layer 51 has a thickness of, for example, about several tens of nm, and is configured by providing a diffraction grating in which the n-type InP layer and the n-type InGaAsP layer are arranged alternately in the direction of the optical axis (in the direction perpendicular to the plane of the paper of FIG. 3). The period of the diffraction grating is set such that the oscillation wavelength at the time of continuous drive is approximately 1.55 μm, for example, about 230 nm.

The MQW layer 53 is composed of a six-layer well layer and the well layer and a barrier layer have thicknesses of about 5 nm and 10 nm, respectively. An emission wavelength of the MQW layer 53 is set to 1.55 μm.

The guide layers 52 and 54 are formed by sandwiching the upper and lower sides of the MQW layer 53 and each of their thicknesses is 0.1 μm.

The cladding layer 55 is formed into a mesa shape on the guide layers 52 and 54 provided on the upper side of the MQW layer 53 and its width is 2.2 μm and its height is 1.3 μm, as shown in FIG. 3.

The contact layer 56 is formed on the top surface of the cladding layer 55 formed into a mesa shape.

Additionally, although not shown in FIG. 3, metal electrodes are formed on the entirety of top surface of the contact layer 56 and under surface of the n-type InP substrate 50, and the DFB laser 2 is directly modulated and driven using these electrodes.

Next, the ring resonator type wavelength filter 30 has, as shown in FIG. 4, a structure in which an n-InGaAsP guide layer 52A, an n-InGaAsP guide layer 52B, an i-InGaAsP core layer 57, the p-InP cladding layer 55, and the p-InGaAs contact layer 56 are sequentially stacked on the n-type InP substrate 50.

Incidentally, the composition of the undoped and n-type InGaAsP layers 52A, 57, and 54A is made to somewhat differ from that of the DFB laser 2. This is for adjusting the equivalent refractive index of the optical waveguide constituting the ring resonator type wavelength filter 30 in order to match it with the equivalent refractive index of the optical waveguide constituting the DFB laser 2. For example, the equivalent refractive index is set to about 3.25. Due to this, an anti-reflective effect can be obtained.

The ring resonator type wavelength filter 30 is not provided with the MQW layer 53 or the upper and lower metal electrodes, which are provided for the above-mentioned DFB laser 2. Due to this, the ring resonator type wavelength filter 30 is configured as a passive optical waveguide with a small transmission loss as a whole.

Additionally, other configurations of the ring resonator type wavelength filter 30 are the same as those of the DFB laser 2.

Next, the design of the ring resonator type wavelength filter 30 will be described in detail.

Note that here, the oscillation wavelength of the DFB laser 2 is set to approximately 1.55 μm and the modulation rate is set to 10 Gb/s.

Figure 5:
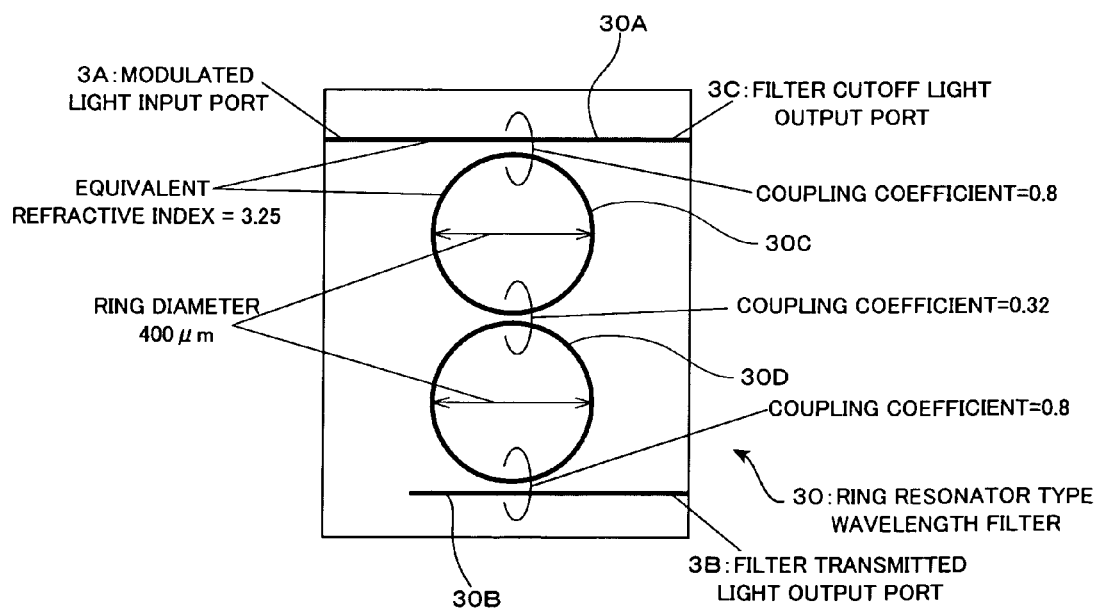
FIG. 5 is schematic diagram for explaining a design example of a ring resonator type wavelength filter constituting the optical transmitter according to the first embodiment of the present invention.

In the present embodiment, as shown in FIG. 5, the ring resonator type wavelength filter 30 is configured as one in which the two ring-shaped optical waveguides 30C and 30D are connected in series and the linear optical waveguides 30A and 30B for input/output are formed on both of the sides.

As specific design values, as shown in FIG. 5, each of the equivalent refractive index of the linear and ring-shaped optical waveguides 30A to 30D is set to 3.25, each of the diameter of the two ring-shaped optical waveguides 30C and 30D is set to 400 μm, each of the coupling coefficient between the linear optical waveguides 30A and 30B and the ring-shaped optical waveguides 30C and 30D is set to 0.8, and the coupling coefficient between the ring-shaped optical waveguides 30C and 30D is set to 0.32.

When designed as above, the ratio of the power (this is assumed to be 100%) of light inputted to the wavelength filter 30 via the first linear optical waveguide 30A on the input side to the power of light that coupled and transferred to the adjoining first ring-shaped optical waveguide 30C is about 51% because the coupling coefficient is 0.8. Further, the ratio of the power of light that has been transferred to the first ring-shaped optical waveguide 30C to the power of light that coupled and transferred to the adjoining second ring-shaped optical waveguide 30D is about 9.9% because the coupling coefficient is 0.32. Furthermore, the ratio of the power of light that has been transferred to the second ring-shaped optical waveguide 30D to the power of light that coupled and transferred to the adjoining second linear optical waveguide 30B is about 51% because the coupling coefficient is 0.8.

Figure 6:
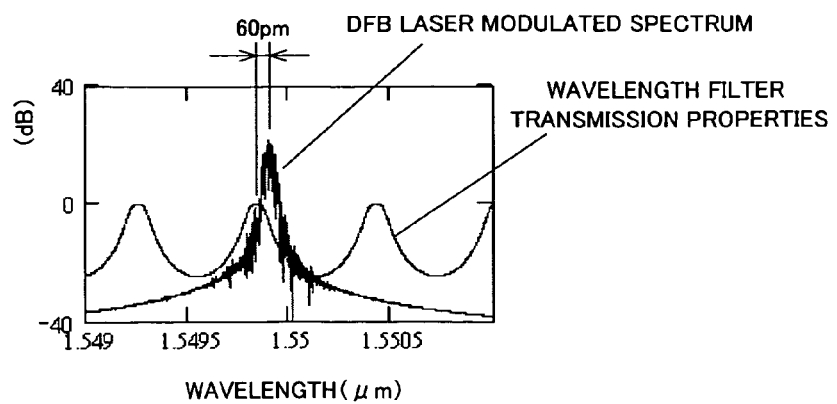
FIG. 6 is a diagram showing wavelength filter transmission properties of the optical transmitter and a modulated spectrum of the DFB laser according to the first embodiment of the present invention.

Here, FIG. 6 shows the calculation result of the transmission properties (cutoff properties) of the ring resonator type wavelength filter 30 as described above.

As is understood from the calculation result in FIG. 6, this ring resonator type wavelength filter 30 has a free spectral range (FSR) of about 0.7 nm and a half-value width of about 90 μm.

Further, FIG. 6 also shows a calculation example of the modulated spectrum of light inputted from the DFB laser 2 to the ring resonator type wavelength filter 30. Additionally, this is a modulated spectrum when the DFB laser 2 is modulated at 10 Gb/s.

As shown in FIG. 6, at a wavelength around which the transmittance falls by 3 dB, the steepness of the filter cutoff properties to the wavelength, that is, the slope of the filter transmission properties (the change rate of the intensity of the filter transmitted light to the wavelength) results in about 170 dB/nm.

Particularly, in the low chirp directly modulated laser, it is important to appropriately set the steepness of the cutoff properties of the wavelength filter to the wavelength.

For example, it is preferable to set the steepness of the filter cutoff properties (the change rate of the intensity of the filter transmitted light to the wavelength) to, for example, between 100 dB/nm and 300 dB/nm at a wavelength around which the transmission light intensity falls by 3 dB, as described above, for the modulated spectrum of the signal light output from the DFB laser 2 directly modulated at a modulation rate of 10 Gb/s.

Figure 7:
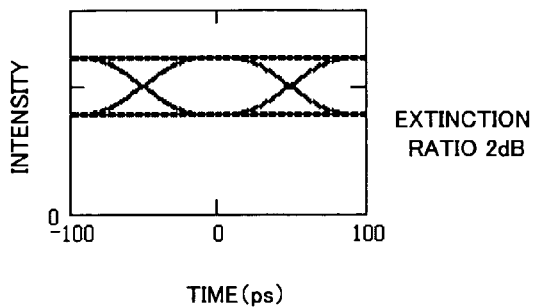
FIG. 7 is a diagram showing an intensity waveform of the DFB laser output light of the optical transmitter according to the first embodiment of the present invention.

Here, FIG. 7 shows an intensity waveform (eye pattern) of laser modulated light (signal light) having a DFB laser modulated spectrum (signal spectrum) shown in FIG. 6.

As shown in FIG. 7, laser modulated light from DFB laser has an extinction ratio of about 2 dB. Additionally, it is designed so that the difference in oscillation wavelength (difference in wavelength of laser output light) between the cases of ON level and OFF level is about 5 GHz.

By the way, in the present embodiment, as shown in FIG. 6, the center (peak) of the filter transmission band of the wavelength filter 30 is set on a shorter wave side by a predetermined value (here, about 60 pm) to the center (peak) of the modulated spectrum of laser light (signal light) inputted to the wavelength filter 30 from the DFB laser 2.

Figure 8:
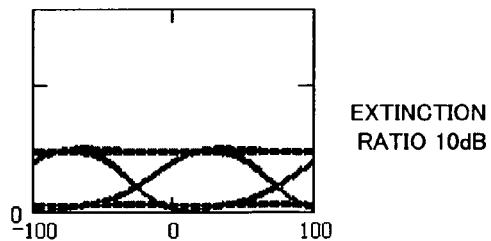
FIG. 8 is a diagram showing an intensity waveform of the wavelength filter transmitted light of the optical transmitter according to the first embodiment of the present invention.

By performing filtering processing by use of the wavelength filter 30 with such properties (that is, after passing through the filter), the intensity waveform (eye pattern) shown in FIG. 7 becomes such one as shown in FIG. 8 and the extinction ratio increases up to about 10 dB.

Figure 9:
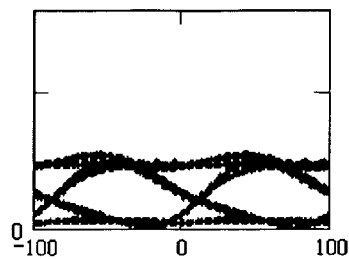
FIG. 9 is a diagram showing an intensity waveform after 80 km transmission, using an optical fiber, of the wavelength filter transmitted light of the optical transmitter according to the first embodiment of the present invention.

Then, the signal light (laser modulated light) having the intensity waveform (eye pattern) as shown in FIG. 7 is transmitted 80 km using a general 1.3 μm band zero dispersion fiber (dispersion value=16.7 ps/nm·km), and as a result, the intensity waveform (eye pattern) of the signal light after transmission is as shown in FIG. 9. As described above, by being passed through the wavelength filter 30, the extinction ratio increases and the width of the signal spectrum becomes narrow, therefore, it is possible to observe an opening of the excellent eye pattern even after the 80 km transmission.

Consequently, the optical transmitter according to the present embodiment has advantages that it is capable of long distance optical fiber transmission, like the low chirp directly modulated laser in the prior art, and that the configuration can be simplified, the production cost can be reduced, and the size can be reduced in comparison with the low chirp directly modulated laser in the prior art because the DFB laser 2 and the ring resonator type wavelength filter 30 are integrated and formed into one device.

Particularly, the present embodiment has an advantage that since the filter cutoff light is designed to be emitted to the outside (outside the device), it is unlikely that the light returns to the DFB laser and adversely affects the operation.

Second Embodiment

Next, an optical transmitter according to a second embodiment of the present invention will be explained with reference to FIG. 10.

Figure 10:
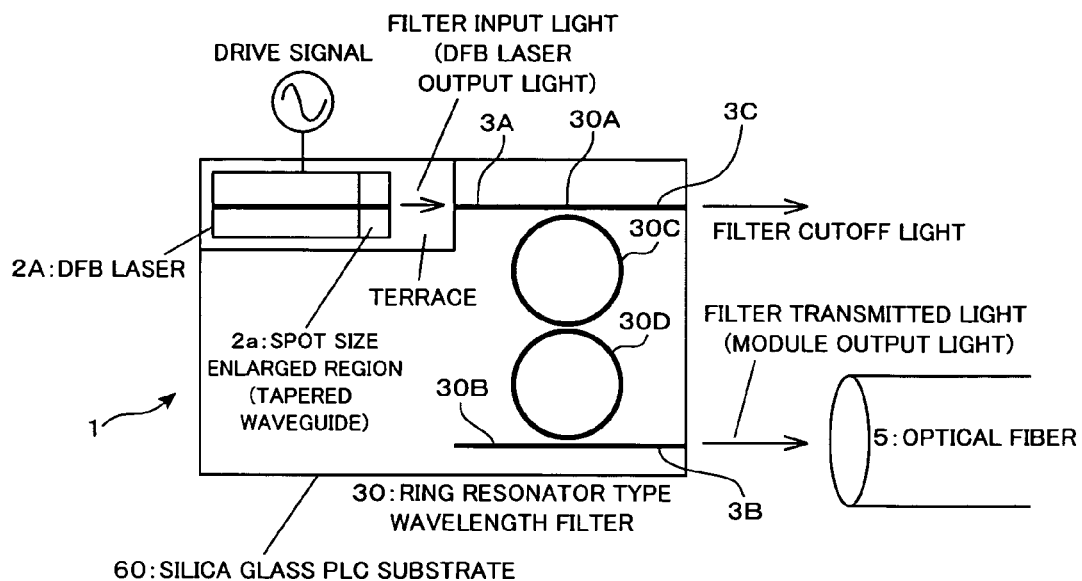
FIG. 10 is a schematic diagram showing a configuration of an optical transmitter according to a second embodiment of the present invention.

As shown in FIG. 10, the configuration of the optical transmitter (optical transmitter module; low chirp directly modulated laser) according to the present embodiment resembles the first embodiment (refer to FIG. 2) in that the DFB laser and the ring resonator type wavelength filter are used but differs in that the wavelength filter 30 is formed on a planer lightwave circuit (PLC) substrate 60 made of a silica glass material and a DFB laser 2A is integrated in a hybrid manner using the PLC substrate 60 as a platform. Incidentally, in FIG. 10, the same components as those in the first embodiment described above (refer to FIG. 2) are assigned with the same symbols.

Additionally, here, as the planer lightwave circuit (PLC) substrate 60, one made of silica glass is used, however, the substrate is not limited to this, and it is only necessary to use a planer lightwave circuit substrate formed of at least one of silica glass, polymer, silicon, dielectric, and semiconductor materials.

Here, the DFB laser 2A is mounted on the PLC substrate 60 such that there is a predetermined space between the output end surface of the DFB laser 2A and the modulated light input port 3A of the PLC substrate 60. Incidentally, the region of surface of the PLC substrate 60 on which the DFB laser 2A is mounted is referred to as a terrace.

Additionally, to the end surfaces of the DFB laser 2A and the PLC substrate 60 is applied an anti-reflective coating.

Thus, if the wavelength filter 30 and the DFB laser 2A are formed separately, it is made possible to optimize them individually.

Here, as the DFB laser 2A, it is only necessary to use one having the same stacked structure as that in the first embodiment. Also, the DFB laser 2A maybe configured as that having an buried type optical waveguide structure.

Particularly, in the present embodiment, the DFB laser 2A is configured by providing a spot size enlarged region 2a capable of enlarging a spot size of laser light (modulated light) at the end surface on the output side thereof as shown in FIG. 10. Here, the spot size enlarged region 2a is configured by a tapered waveguide. The tapered waveguide may be configured such that, for example, the width (or film thickness) of the cladding layer of the optical waveguide constituting the DFB laser 2A becomes smaller gradually.

In this manner, it is aimed that the output light (modulated light) from the DFB laser 2A can be optically coupled to the wavelength filter 30 provided on the PLC substrate 60 with high efficiency without providing, for example, a coupling lens.

Further, it is also aimed that laser light (modulated light) is inputted to the wavelength filter 30 with its spot size enlarged, therefore, it is made possible to optically couple the transmitted light (module output light) from the wavelength filter 30 directly to the optical fiber 5 without providing, for example, a coupling lens.

The ring resonator type wavelength filter 30 is configured as one in which the two ring-shaped optical waveguides 30C and 30D are connected in series between the two linear optical waveguides 30A and 30B, like the first embodiment described above.

However, in the present embodiment, the ring resonator type wavelength filter 30 is configured by an optical waveguide made of a silica glass material, therefore, specific design values differ from those in the first embodiment.

However, in this case also, it is only necessary to design the diameter and the coupling coefficient of the ring-shaped optical waveguides 30C and 30D such that the half-value width is about 90 nm, the slope of the cutoff properties at a wavelength around which the transmittance falls by 3 dB results in 170 dB/nm, and the center of the filter transmission band is set on a shorter-wave side by about 60 μm from the center of the modulated spectrum of the light output from the DFB laser 2A as the properties of the wavelength filter 30 obtained finally.

Incidentally, other configurations and operations are the same as those in the first embodiment described above, therefore, their explanation is omitted here.

Consequently, by using the optical transmitter (low-chirp DML) in the present embodiment, long distance optical fiber transmission is made possible, like the first embodiment described above. Further, since the ring resonator type wavelength filter 30 is used and the filter cutoff light is emitted to the outside, it is unlikely that the light returned to the DFB laser 2A adversely affects the operation of the DFB laser 2A.

Particularly, in the present embodiment, since the DFB laser 2A and the wavelength filter 30 are integrated in a hybrid manner, in comparison with those in the first embodiment described above, although the assembling cost of whole devices is somewhat increased, no isolator is required and optical coupling using a lens is no longer necessary in comparison with the low-chirp DML in the prior art, therefore, there are advantages that the total assembling cost can be suppressed low and the total size of the optical module can also be reduced.

Third Embodiment

Next, an optical transmitter according to a third embodiment of the present invention will be described with reference to FIG. 11.

Figure 11:
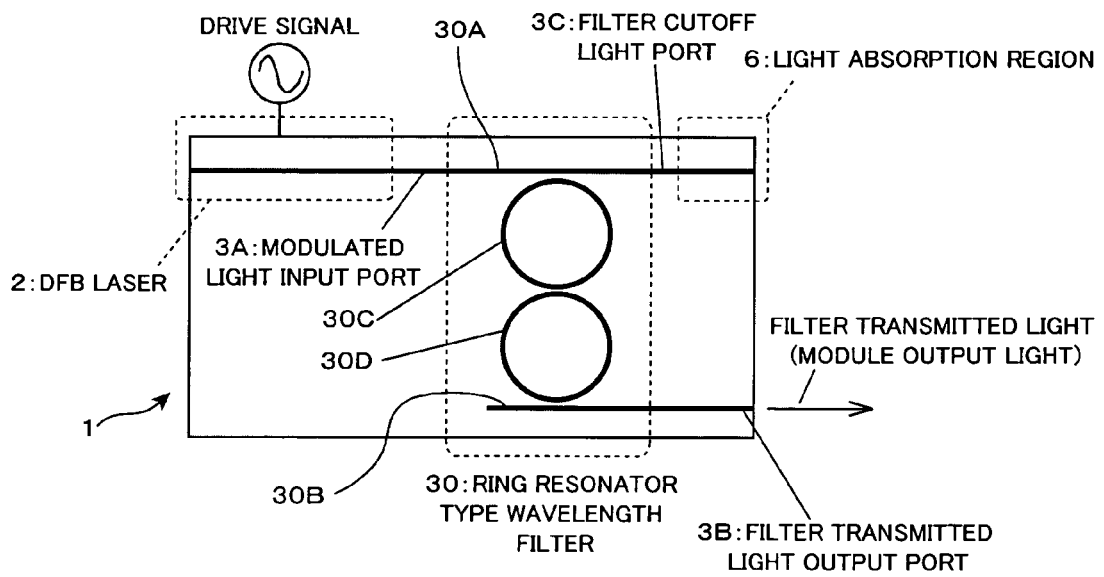
FIG. 11 is a schematic diagram showing a configuration of an optical transmitter according to a third embodiment of the present invention.

As shown in FIG. 11, the optical transmitter (optical transmitter module; low chirp directly modulated laser) according to the present embodiment differs from the first embodiment described above in that a light absorption region 6 is provided, which is capable of absorbing the filter cutoff light output from the filter cutoff light output port 3C (or the optical waveguide connected to the filter cutoff light output port 3C) of the wavelength filter 30. Incidentally, in FIG. 11, the same components as those in the first embodiment (refer to FIG. 2) described above are assigned with the same symbols.

Here, in the light absorption region 6, it is only necessary to arrange a material whose absorption end wavelength is positioned on a longer-wavelength side than the longest wavelength of the filter cutoff light so that light having all of the wavelengths included in the spectrum of the filter cutoff light is absorbed.

For example, the light absorption region 6 may be configured as one having the same material and the same sectional structure as those of the DFB laser 2 (refer to FIG. 3) in the first embodiment described above. Then, being different from the DFB laser 2, the potentials of the p-type InGaAs contact layer 56 and the p-type InP cladding layer 55 are set to become smaller than the potential of the n-type InP substrate 50, and the pn junction is kept either at the same potential or at a reverse bias voltage.

Incidentally, other configurations and operations are the same as those in the first embodiment described above, such that the DFB laser 2 and the ring resonator type wavelength filter 30 are integrated and formed into one device on the n-type InP substrate 50, therefore, no explanation is given here.

Consequently, the optical transmitter according to the present embodiment is capable of long distance optical fiber transmission, like the first embodiment described above, and has advantages that the configuration can be simplified, the production cost can be reduced, and the size can be reduced in comparison with the low chirp directly modulated laser in the prior art because the DFB laser 2 and the ring resonator type wavelength filter 30 are integrated and formed into one device.

Particularly, in the present embodiment, the possibility that the filter cutoff light cut off by the wavelength filter 30 goes astray after discharged (emitted) to the outside (outside the device) is eliminated and there are advantages that the light is unlikely to adversely affect the entire operation of the optical transmitter module including the DFB laser 2 as returned light and that the light is unlikely to be inputted to the optical fiber arranged ahead of the filter transmitted light output port 3B as noises.

Fourth Embodiment

Next, an optical transmitter according to a fourth embodiment of the present invention will be described with reference to FIG. 12.

Figure 12:
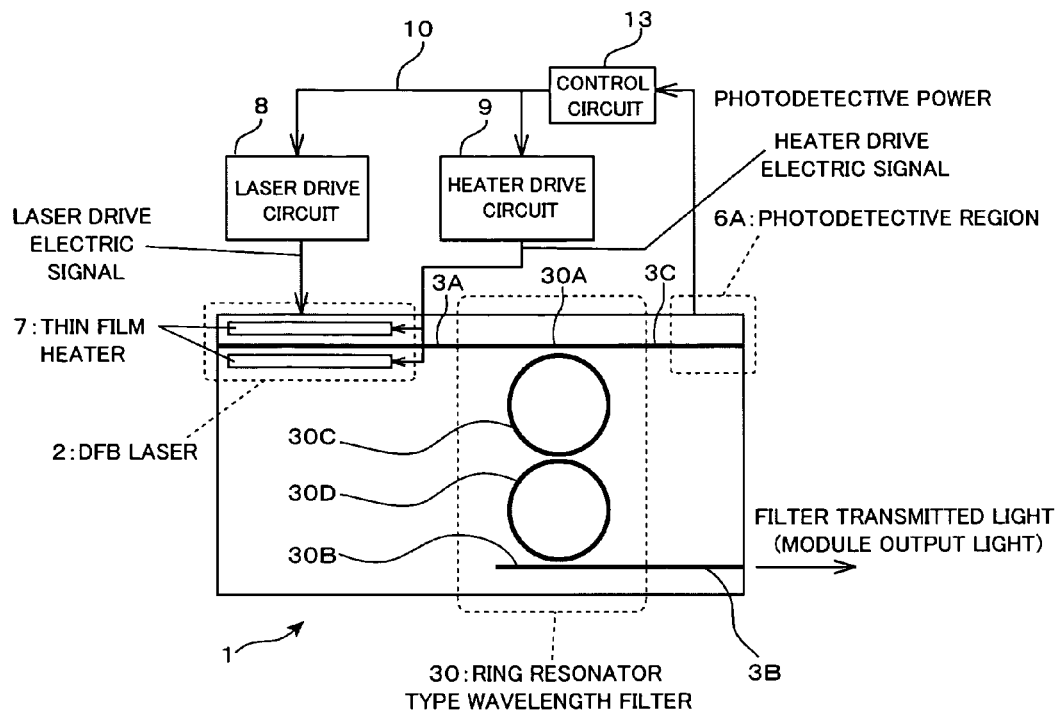
FIG. 12 is a schematic diagram showing a configuration of an optical transmitter according to a fourth embodiment of the present invention.

As shown in FIG. 12, the optical transmitter (optical transmitter module; low chirp directly modulated laser) according to the present embodiment differs from the third embodiment described above (refer to FIG. 11) in that the light absorption region 6 is used as a monitor photodetector (photodetective region) 6A for detecting the filter cutoff light output from the filter cutoff light output port 3C and the amount of wavelength detuning between the center of the oscillation wavelength of the DFB laser 2 (the spectrum center of the modulated light from the DFB laser 2) and the center of the filter transmission band of the wavelength filter 30 is controlled by monitoring the amount of the filter cutoff light (photodetective power) and changing the oscillation wavelength of the DFB laser 2. Note that in FIG. 12, the same components as those in the third embodiment described above (refer to FIG. 11) are assigned with the same symbols. Due to this, it is made possible to realize a more stable operation as a low-chirp DML.

Because of this, the optical transmitter according to the present embodiment is provided with, in addition to the configuration of the third embodiment described above (refer to FIG. 11), as shown in FIG. 12, a thin film heater (heater device; temperature control device) 7 in the DFB laser 2 in order that the temperature of the DFB laser 2 can be controlled and further provided with a laser drive circuit 8 for outputting a laser drive electric signal to drive the DFB laser 2, a heater drive circuit 9 for outputting a heater drive electric signal to drive the thin film heater 7, and a control circuit 13 for controlling the DFB laser 2 and the thin film heater 7 via these drive circuits 8 and 9.

Here, the control circuit 13 is connected to the photodetective region 6A as a monitor photodetector and designed so as to monitor the amount of filter cutoff light (photodetective power) and perform feedback control of the drive conditions of the DFB laser 2 (the wavelength detuning between the oscillation wavelength of the DFB laser 2 and the wavelength filter 30 is also included) based on this such that the DFB laser 2 is brought into a preferred state.

Here, a feedback circuit 10 is connected between the DFB laser 2 and the photodetective region 6A and the control circuit 13 is designed so as to perform drive control (feedback control) of the DFB laser 2 via the laser drive circuit 8 based on the power of the filter cutoff light obtained from the photodetective region 6A.

Further, the feedback circuit 10 is connected between the thin film heater 7 and the photodetective region 6A, and the control circuit 13 is designed so as to perform the drive control (feedback control; here, control of the current injected to the thin film heater 7) of the thin film heater 7 via the heater drive circuit 9 based on the power of the filter cutoff light obtained from the photodetective region 6A. Due to this, the temperature of the DFB laser 2 changes locally and as a result, the oscillation wavelength of the DFB laser 2 changes and the amount of wavelength detuning between the center of the oscillation wavelength of the DFB laser 2 and the center of the filter transmission band of the wavelength filter 30 is adjusted.

Incidentally, other configurations and operations are the same as those in the third embodiment described above, therefore, no explanation is given here.

Therefore, the optical transmitter according to the present embodiment is capable of long distance optical fiber transmission, like the first embodiment described above, and has advantages that the configuration can be simplified, the production cost can be reduced, and the size can be reduced in comparison with the low chirp directly modulated laser in the prior art because the DFB laser 2 and the ring resonator type wavelength filter 30 are integrated and formed into one device.

Particularly, in the present embodiment, the possibility that the filter cutoff light cut off by the wavelength filter 30 goes astray after discharged (emitted) to the outside (outside the device) is eliminated, and there are advantages that the light is unlikely to adversely affect the entire operation of the optical transmitter module including the DFB laser 2 as returned light and that the light is unlikely to be inputted to the optical fiber arranged ahead of the filter transmitted light output port 3B as noises.

Further, in the present embodiment, it is possible to control the drive conditions of the DFB laser 2 (the wavelength detuning between the oscillation wavelength of the DFB laser 2 and the cut-off wavelength of the filter 30 is also included) such that the DFB laser 2 is brought into a preferred state, therefore, it is made possible to realize a more stable operation as a low-chirp DML.

Additionally, in the embodiment described above, the heater 7 is arranged on the DFB laser 2 and wavelength detuning between the oscillation wavelength of the DFB laser 2 and the cut-off wavelength of filter 30 is performed by changing the temperature of the DFB laser 2 using the heater 7, however, it is not limited thereto, and for example, a heater may be arranged on the wavelength filter 30 and wavelength detuning may be performed by changing the temperature of the wavelength filter 30 using the heater [that is, by providing a heater capable of controlling the temperature of the wavelength filter 30 (a temperature control device)] or heaters may be arranged on both the DFB laser 2 and the wavelength filter 30 and wavelength detuning may be performed by individually (independently) changing the temperatures of the DFB laser 2 and the wavelength filter 30 using the respective heaters [that is, by providing heaters capable of controlling both the DFB laser 2 and the wavelength filter 30 (temperature control devices)].

Further, in the embodiment described above, the thin film heater 7 is provided and it is controlled by the heater drive circuit 9, however, it is not limited thereto.

Figure 13:
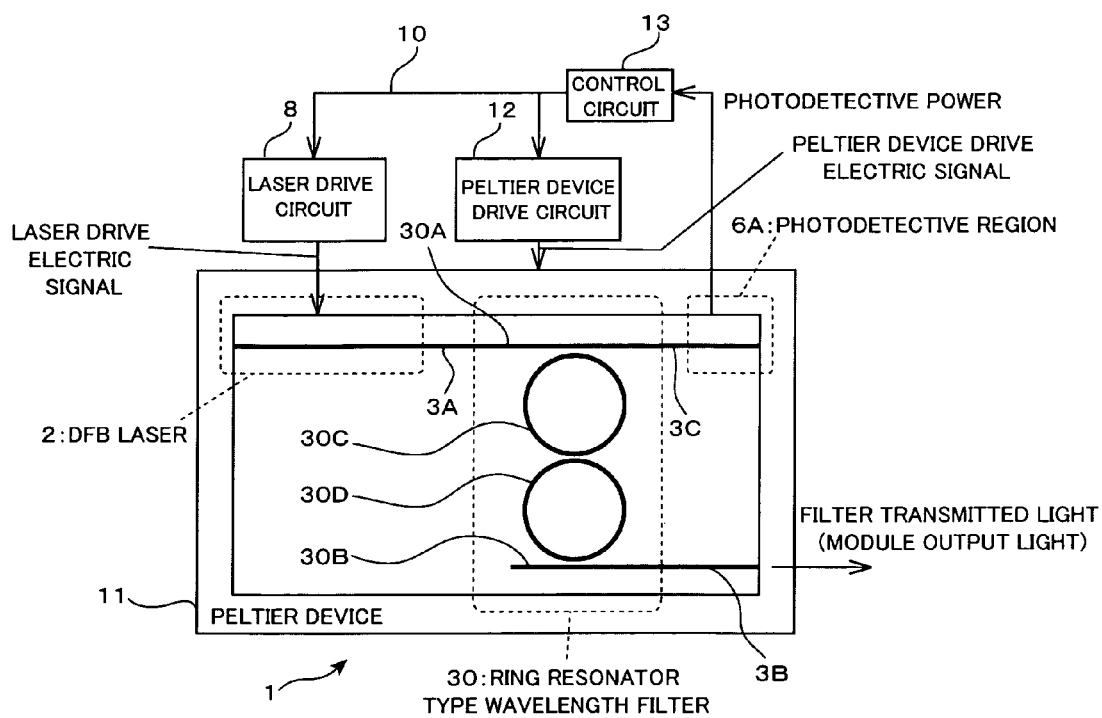
FIG. 13 is a schematic diagram showing a configuration of an optical transmitter according to a modification example of the fourth embodiment of the present invention.

For example, as shown in FIG. 13, there is provided a Peltier device (cooler device; temperature control device) 11 instead of the thin film heater 7. Further, there are provided a Peltier device drive circuit 12 for outputting an electric signal to drive the Peltier device 11 and the control circuit 13 for controlling the Peltier device 11 via the drive circuit 12. Then, it may be also possible for the control circuit 13 to perform drive control (feedback control) of the Peltier device 11 via the Peltier device drive circuit 12 based on the power of the filter cutoff light obtained from the photodetective region 6A. In this case, the whole of a device (integrally formed device) into which the DFB laser 2 and the wavelength filter 30 are integrally formed is controlled in temperature by the Peltier device 11. In sum, wavelength detuning may be performed by providing the Peltier device (cooler device; temperature control device) 11 capable of controlling the temperatures of both the DFB laser 2 and the wavelength filter 30.

In this case, although the effect is not to such an extent as that of the above-mentioned embodiments because it is difficult to control the temperature of the DFB laser 2 independently of the temperature of the wavelength filter 30, the similar effect can be obtained.

Further, it is also possible to configure one in which both the thin film heater 7 and the Peltier device 11 are provided by combining the above-mentioned embodiment (refer to FIG. 12) and the modification example (refer to FIG. 13) in which the Peltier device 11 is provided.

Fifth Embodiment

Next an optical transmitter according to a fifth embodiment of the present invention will be described with reference to FIG. 14.

The optical transmitter according to the present embodiment has a configuration of the wavelength filter different from that in the above-mentioned first embodiment.

Figure 14:
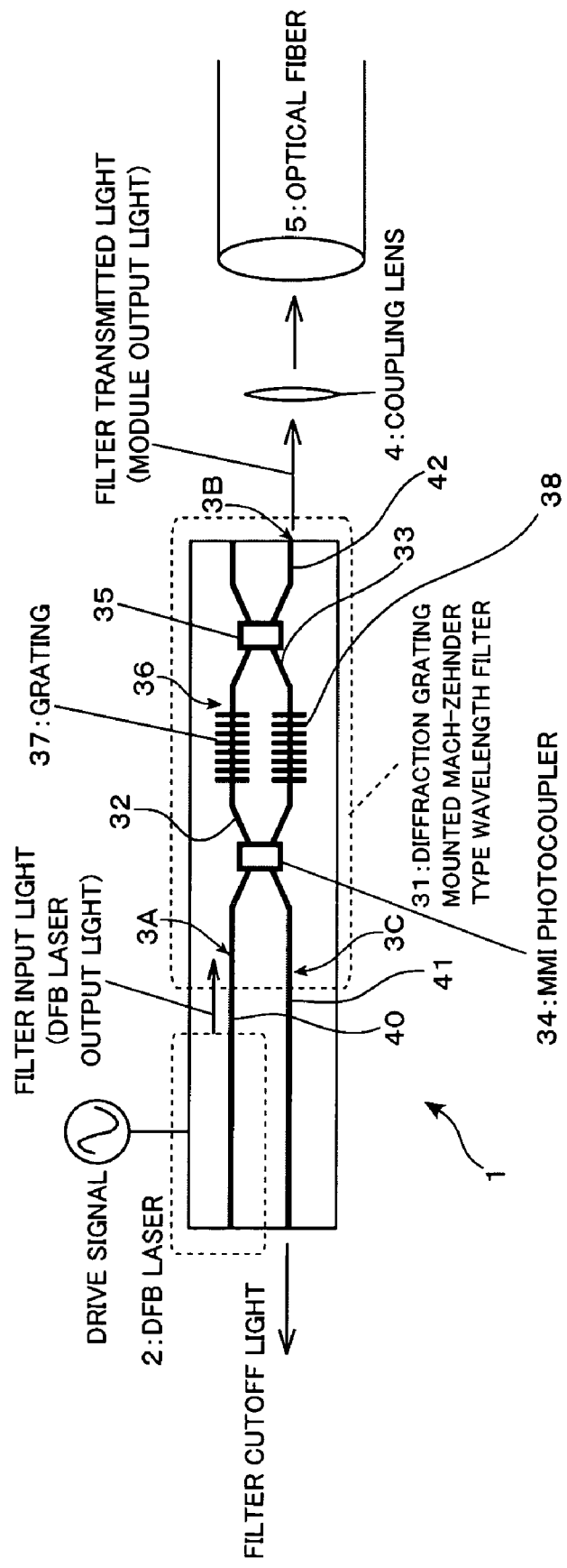
FIG. 14 is a schematic diagram showing a configuration of an optical transmitter according to a fifth embodiment of the present invention.

In other words, in the present embodiment, the optical transmitter (optical transmitter module; low chirp directly modulated laser) is configured as an integrated device (integrally formed device) in which the DFB laser 2 and a diffraction grating mounted Mach-Zehnder (MZ) type wavelength filter 31 as a waveguide type wavelength filter are integrated on the n-type InP substrate 50 as shown in FIG. 14. Additionally, to both of the end surfaces of the device is applied an anti-reflective coating. Incidentally, in FIG. 14, the same components as those in the above-mentioned first embodiment (refer to FIG. 2) are assigned with the same symbols.

Here, the diffraction grating mounted MZ type wavelength filter 31 is configured by including a Mach-Zehnder interferometer 36 having two linear optical waveguides (arms) 32 and 33 and diffraction gratings (gratings; diffraction grating type wavelength filters) 37 and 38 formed on the respective two linear optical waveguides 32 and 33 in the Mach-Zehnder interferometer 36. Additionally, the diffraction gratings 37 and 38 provided on the respective two optical waveguides 32 and 33 in the Mach-Zehnder interferometer 36 have the same structure.

Further, the Mach-Zehnder interferometer 36 is provided with two multi mode interference (MMI) photocouplers 34 and 35.

Connected to the MMI photocoupler 34 on a pre-stage constituting the Mach-Zehnder interferometer 36 are two optical waveguides on its input side. The end of the optical waveguide on one side constitutes the modulated light input port 3A and the end of the other optical waveguide constitutes the filter cutoff light output port 3C. Then, to the modulated light input port 3A, the DFB laser 2 is connected via a modulated light input optical waveguide 40. Connected to the filter cutoff light output port 3C is a filter cutoff light output optical waveguide 41 extending to the device end surface.

Further, to the MMI photocoupler 35 on a post-stage constituting the Mach-Zehnder interferometer 36, a filter transmitted light output optical waveguide 42 extending to the device end surface is connected on its output side, and the end of the filter transmitted light output optical waveguide 42 constitutes the filter transmitted light output port 3B.

Thus, in the present embodiment, the diffraction grating mounted MZ type wavelength filter 31 results in a configuration in which the three ports: the modulated light input port 3A, the filter transmitted light output port 3B, and the filter cutoff light output port 3C are spatially individually arranged.

Since configured as above, the modulated light output from the DFB laser 2 is inputted to the modulated light input port 3A of the wavelength filter 31 via the modulated light input optical waveguide 40, branched by the MMI photocoupler 34 on the pre-stage of the wavelength filter 31, and guided to the respective diffraction gratings 37 and 38 through the linear optical waveguides 32 and 33. Then, light having a wavelength included in the filter transmission band of the diffraction gratings 37 and 38 (filter transmitted light) passes through the respective diffraction gratings 37 and 38, multiplexed to each other by the MMI photocoupler 35 on the post-stage, and output as filter transmitted light (module output light) from the filter transmitted light output port 3B via the filter transmitted light output optical waveguide 42 connected to the MMI photocoupler 35 on the post-stage.

Then, the filter transmitted light output from the filter transmitted light output port 3B is designed to be coupled to the optical fiber 5 via the coupling lens 4.

On the other hand, light having a wavelength included in the filter cutoff band of the diffraction gratings 37 and 38 (filter cutoff light) is cut off by the respective diffraction gratings 37 and 38. In other words, the light cut off and reflected by the diffraction gratings 37 and 38 returns to the MMI photocoupler 34 on the pre-stage to be multiplexed and output as filter cutoff light to the outside from the filter cutoff light output port (other than the modulated light input port and the filter transmitted light output port) via the filter cutoff light output optical waveguide 41.

In the present embodiment, both the DFB laser 2 and the diffraction grating mounted MZ type wavelength filter 31 are configured as an buried type optical waveguide.

First, the core of the optical waveguide constituting the DFB laser 2 is formed by an InGaAsP related multiple quantum well (MQW) layer and configured as one having an emission wavelength of, for example, 1.55 μm.

On the other hand, the core of the optical waveguide constituting the diffraction grating mounted MZ type wavelength filter 31 is formed of a material having an emission wavelength of shorter waves in comparison with the optical waveguide constituting the DFB laser 2. For example, it may be formed of a bulk InGaAsP layer etc.

Figure 15:
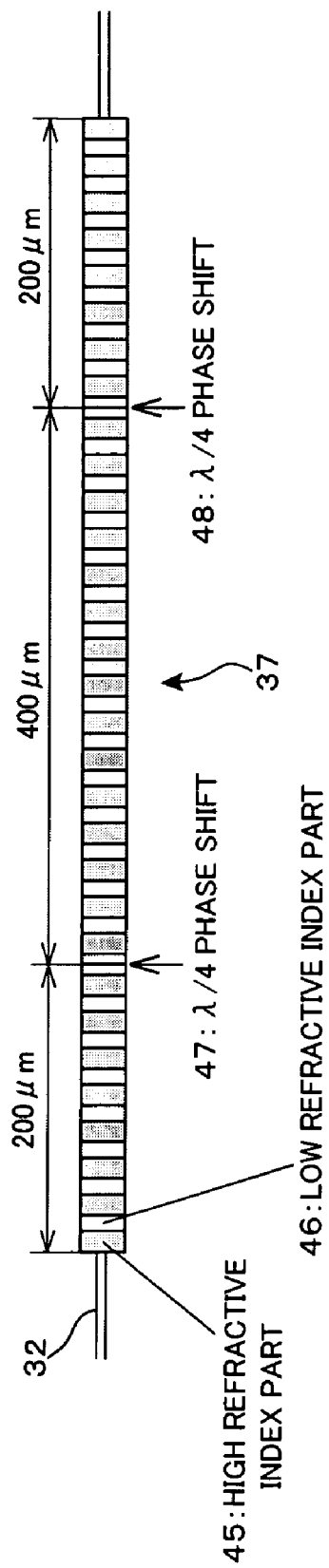
FIG. 15 is a schematic diagram for explaining a configuration of a diffraction grating of the optical transmitter according to the fifth embodiment of the present invention.

Here, FIG. 15 schematically shows the structure of the diffraction grating 37 (38) formed in the Mach-Zehnder interferometer 36. Additionally, FIG. 15 shows only the diffraction grating 37 provided on the optical waveguide 32 on one side for convenience of explanation.

As shown in FIG. 15, the diffraction grating 37 is formed by alternately forming a high refractive index part 45 and a low refractive index part 46 on a part of the optical waveguide 32. The total length of the part on which the diffraction grating 37 of the optical waveguide 32 is provided is set to 800 μm. All of the diffraction gratings 37 are uniformly manufactured except λ/4 phase shifts 47 and 48 provided at two positions in FIG. 15. The value of the coupling coefficient κ of the diffraction grating 37 is set to 89/cm and the period thereof is set to 238 nm. The average equivalent refractive index of the optical waveguide 32 at the part on which the diffraction grating 37 is provided is 3.25.

Figure 16:
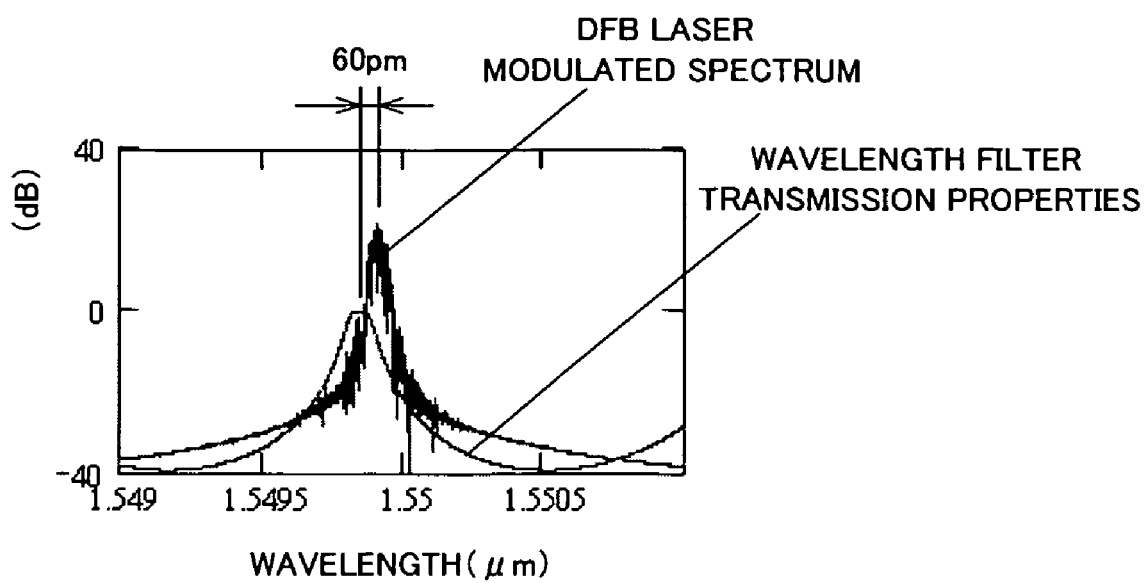
FIG. 16 is a diagram showing wavelength filter transmission properties of the optical transmitter and a modulated spectrum of a DFB laser according to the fifth embodiment of the present invention.

The transmission spectrum (transmission properties; cutoff properties) of the diffraction grating mounted Mach-Zehnder type wavelength filter 31 configured using such a diffraction grating 37 is as shown in FIG. 16. Additionally, FIG. 16 also shows a calculation example of the modulated spectrum of light to be inputted from the DFB laser 2 to the diffraction grating mounted Mach-Zehnder type wavelength filter 31.

The half-value width of the peak of the transmission properties of the wavelength filter 31 obtained from the wavelength filter transmission properties shown in FIG. 16 is about 90 pm like that in the above-mentioned first embodiment (refer to FIG. 6).

As shown in FIG. 16, at a wavelength around which the transmittance falls by 3 dB, the steepness of the filter cutoff properties to the wavelength (the change rate of the intensity of the filter transmitted light to the wavelength) results in also about 170 db/nm, like that in the above-mentioned first embodiment.

Further, as shown in FIG. 16, in the present embodiment also, like the above-mentioned first embodiment, the center (peak) of the filter transmission band of the wavelength filter 31 is set on a shorter-wave side by a predetermined value (here, about 60 pm) to the center (peak) of the modulated spectrum of the laser light (signal light) to be inputted from the DFB laser 2 to the wavelength filter 31.

Thus, since the filter properties are set like the above-mentioned first embodiment, in the present embodiment also, the same eye pattern (refer to FIG. 8) of the filter transmitted light as that in the above-mentioned first embodiment and the eye pattern (refer to FIG. 9) after 80 km transmission using the optical fiber can be obtained.

Incidentally, since other configurations etc. are the same as those in the above-mentioned first embodiment, no explanation is given here.

Therefore, according to the optical transmitter of the present embodiment, the same functions and effects as those in the above-mentioned first embodiment can be obtained. In other words, long distance optical fiber transmission is made possible while realizing an integrally formed simple configuration by integrating the DFB laser 2 and the wavelength filter 31. Further, it is unlikely that the filter cutoff light acts as returned light and adversely affects the operation of the DFB laser 2.

Sixth Embodiment

Next, an optical transmitter according to a sixth embodiment of the present invention will be described with reference to FIG. 17.

The optical transmitter according to the present embodiment resembles the above-mentioned fifth embodiment in including the Mach-Zehnder interferometer type wavelength filter but differs in that a ring resonator is provided in the vicinity of the linear optical waveguides on one side instead of the diffraction grating.

Figure 17:
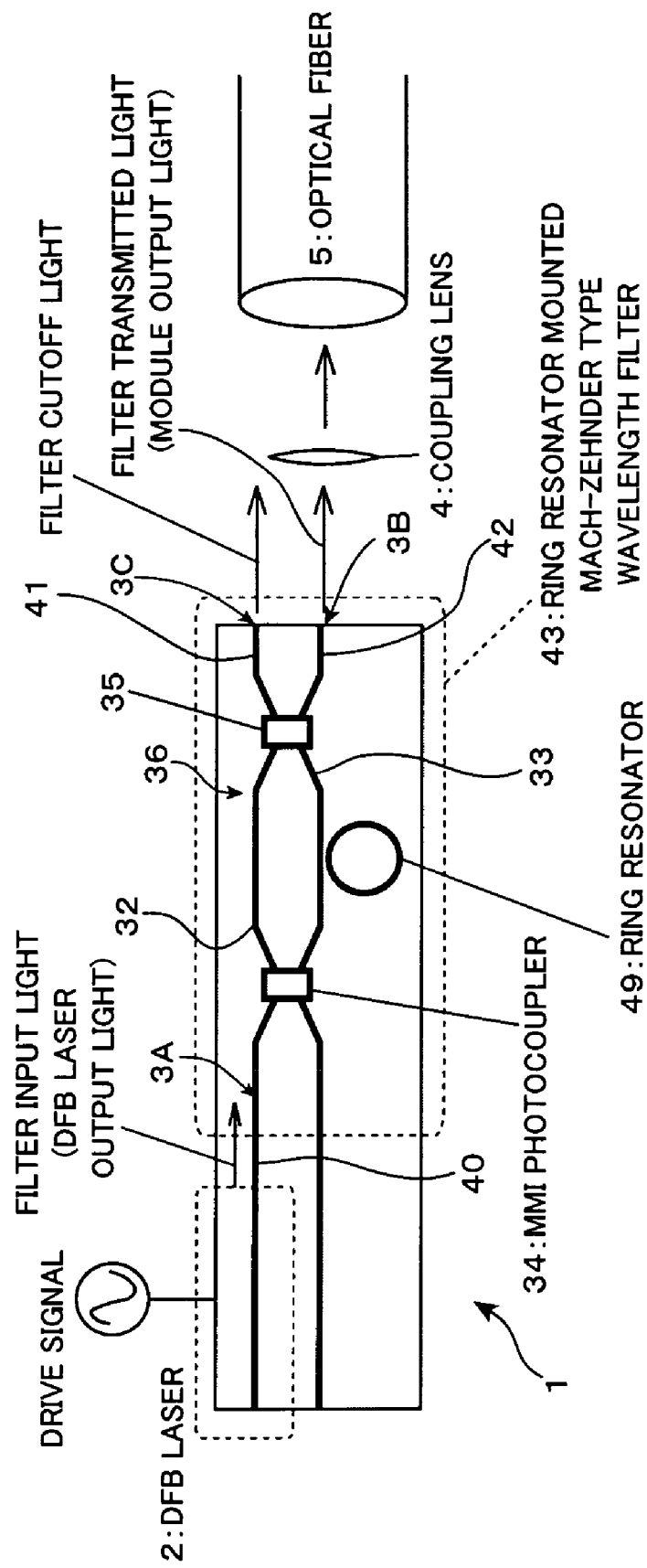
FIG. 17 is a schematic diagram showing a configuration of an optical transmitter according to a sixth embodiment of the present invention.
Figure 18:
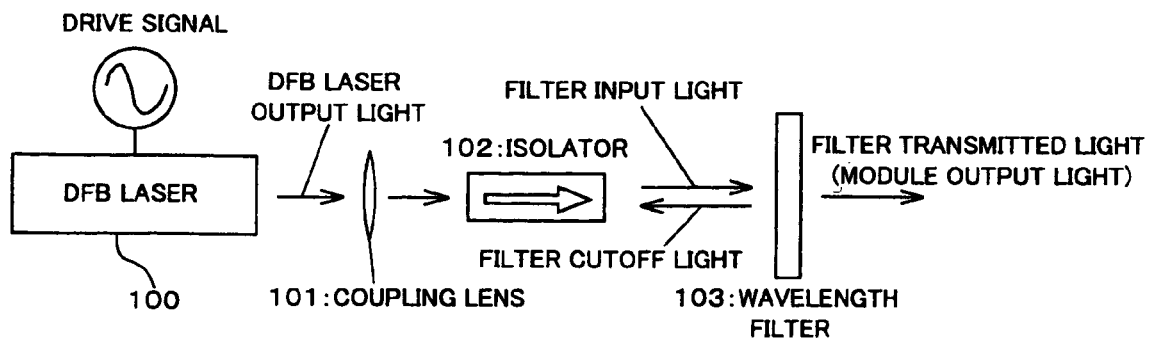
FIG. 18 is a schematic diagram showing a configuration of a low chirp directly modulated laser according to a prior art.
Figure 19:
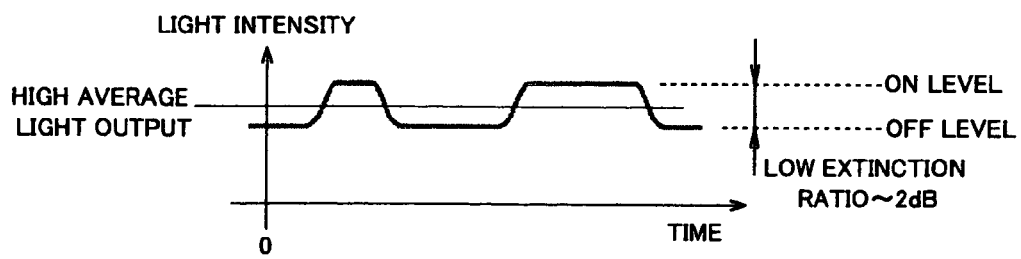
FIG. 19 is a diagram showing an intensity waveform of output light from a DFB laser in the low chirp directly modulated laser according to the prior art.
Figure 20:
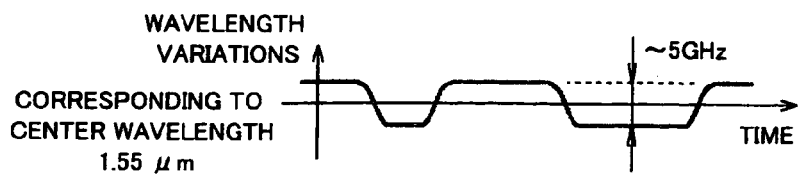
FIG. 20 is a diagram showing a wavelength chirp waveform of the output light from the DFB laser in the low chirp directly modulated laser according to the prior art.
Figure 21:
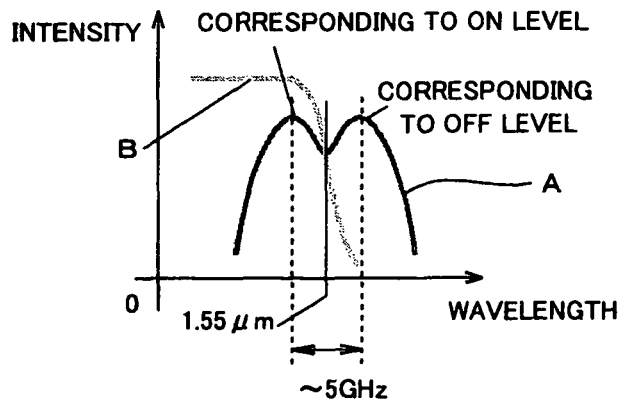
FIG. 21 is a diagram showing a spectrum and a wavelength filter function of the output light from the DFB laser in the low chirp directly modulated laser according to the prior art.
Figure 22:
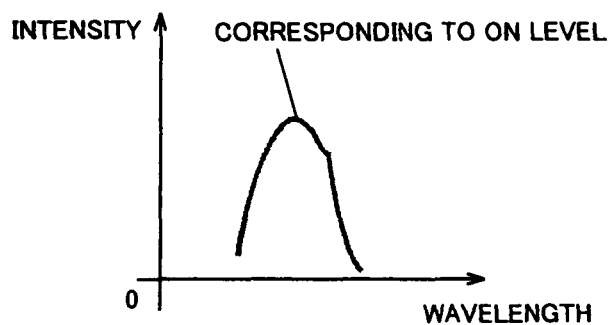
FIG. 22 is a diagram showing a spectrum of wavelength filter transmitted light in the low chirp directly modulated laser according to the prior art.
Figure 23:
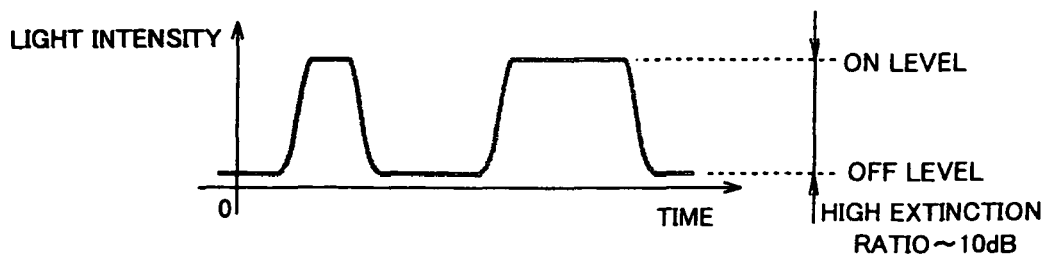
FIG. 23 is a diagram showing an intensity waveform of wavelength filter transmitted light in the low chirp directly modulated laser according to the prior art.

In other words, in the present embodiment, the optical transmitter (optical transmitter module; low chirp directly modulated laser) is configured as an integrated device (integrally formed device) in which the DFB laser 2 and the ring resonator mounted Mach-Zehnder (MZ) type wavelength filter 43 as a waveguide type wavelength filter are integrated on the n-type InP substrate 50 as shown in FIG. 17. Incidentally, in FIG. 17, the same components as those in the above-mentioned fifth embodiment (refer to FIG. 14) are assigned with the same symbols.

Here, the ring resonator mounted MZ type wavelength filter 43 is configured by including the Mach-Zehnder interferometer 36 provided with the two linear optical waveguides (arms) 32 and 33 and the ring resonator (ring resonator type wavelength filter) 49 provided in the vicinity of the linear optical waveguide 33 on one side of the Mach-Zehnder interferometer 36.

Further, the Mach-Zehnder interferometer 36 is provided with two multi mode interference (MMI) photocouplers 34 and 35.

To the MMI photocoupler 34 on the pre-stage constituting the Mach-Zehnder interferometer 36, the optical waveguide is connected on its input side and the end of the optical waveguide constitutes the modulated light input port 3A. To the modulated light input port 3A, the DFB laser 2 is connected via the modulated light input optical waveguide 40.

Further, to the MMI photocoupler 35 on the post-stage constituting the Mach-Zehnder interferometer 36, the two optical waveguides: the filter cutoff light output optical waveguide 41 extending to the device end surface and the filter transmitted light output optical waveguide 42 extending to the device end surface are connected on its output side. Then, the end of the filter cutoff light output optical waveguide 41 constitutes the filter cutoff light output port 3C and the end of the filter transmitted light output optical waveguide 42 constitutes the filter transmitted light output port 3B.

Thus, in the present embodiment, the ring resonator mounted MZ type wavelength filter 43 results in a configuration in which the three ports: the modulated light input port 3A, the filter transmitted light output port 3B, and the filter cutoff light output port 3C are spatially individually arranged.

Due to such a configuration, the modulated light output from the DFB laser 2 is inputted to the modulated light input port 3A of the wavelength filter 32 via the modulated light input optical waveguide 40 and branched into two by the MMI photocoupler 34 on the pre-stage of the wavelength filter 31.

One of the branched light is inputted to the ring resonator (ring resonator type filter) 49 via the linear optical waveguide 33. In this case, light having a wavelength included in the filter transmission band of the ring resonator 49 (filter transmitted light; light having a wavelength in the vicinity of the resonant wavelength of the ring resonator) passes through the ring resonator. On the other hand, the other branched light passes through the linear optical waveguide 32 as it is. Then, they are multiplexed by the MMI photocoupler 35 on the post-stage and output as filter transmitted light (module output light) from the filter transmitted light output port 3B.

Thus, the ring resonator mounted Mach Zehnder interferometer arranged on the post-stage of the DFB laser 2 functions as a wavelength filter. Particularly, by optimizing the structure of the ring resonator, it is possible for this wavelength filter to realize the steep transmission properties (refer to FIG. 16) equivalent to those in the above-mentioned fifth embodiment.

Then, the filter transmitted light output from the filter transmitted light output port 3B is coupled to the optical fiber 5 via the coupling lens 4.

On the other hand, as described above, when the light having propagated through the respective linear optical waveguides 32 and 33 is multiplexed by the MMI photocoupler 35 on the post-stage, light having a wavelength included in the filter cutoff band of the ring resonator (filter cutoff light; light having a wavelength other than the wavelength in the vicinity of the resonant wavelength of the ring resonator) is output as filter cutoff light from the filter cutoff light output port (other than the modulated light input port 3A and the filter transmitted light output port 3B) to the outside.

Thus, the cutoff light by the wavelength filter 43 is output from the port (the filter cutoff light output port 3C) other than the modulated light input port 3A, therefore, it is unlikely that it becomes returned light to the DFB laser 2.

Incidentally, since other configurations etc. are the same as those in the above-mentioned fifth embodiment, no explanation is given here.

Therefore, according to the present embodiment, the same functions and effects as those in the above-mentioned fifth embodiment can be obtained. In other words, long distance optical fiber transmission is made possible while realizing an integrally formed simple configuration by integrating the DFB laser 2 and the wavelength filter 43. Further, it is unlikely that the filter cutoff light becomes returned light and adversely affects the operation of the DFB laser 2.

Others

The filter structure, the details of the settings of the transmission properties, etc. are not limited to the configuration of each embodiment described above. For example, the order (number of stages), the diameter, and the coupling coefficient of the ring resonator, the number of phase shifts, the position, the total length, and the coupling coefficient of the diffraction grating, the details of the filter properties of the half-value width, the steepness of the cutoff properties, the free spectral range (FSR), etc., realized by these filter structures can be appropriately optimized by the properties of the operation wavelengths of the directly modulated laser, the transmission distance of the optical transmitter module, the modulation rate, the required extinction ratio, etc.

Further, each embodiment described above may be arbitrarily combined. For example, the characteristic structures in the third and fourth embodiments, in which the light absorption region and the photodetective region are provided, may be combined with those in the fifth and sixth embodiments.

Furthermore, the present invention is not limited to each of the embodiments described above, and there can be various modifications within the scope of the present invention without departing from the concept thereof.

What is claimed is:

1. An optical transmitter comprising:
   a directly modulated laser; and
   a wavelength filter provided on a post-stage of said directly modulated laser, said wavelength filter comprising:
   a modulated light input port connected to said directly modulated laser and inputting modulated light output from said directly modulated laser;
   a filter transmitted light output port connected to an optical coupling system and outputting light having a wavelength included in a filter transmission band among said modulated light as filter transmitted light; and
   a filter cutoff light output port provided separately from said modulated light input port and said filter transmitted light output port and outputting light having a wavelength included in a filter cutoff band among said modulated light as filter cutoff light,
   wherein the peak of said filter transmission band is set on a shorter-wave side from the peak of the spectrum of modulated light output from said directly modulated laser,
   wherein said wavelength filter is a ring resonator type wavelength filter formed of a ring resonator, and
   said filter transmitted light output port and said filter cutoff light output port are located at an end opposite to said modulated light input port.

2. The optical transmitter according to claim 1, wherein said directly modulated laser and said wavelength filter are integrally formed on the same substrate.

3. The optical transmitter according to claim 1, wherein said directly modulated laser and said wavelength filter are integrated in a hybrid manner on a planar lightwave circuit substrate formed on one of silica glass, polymer, silicon, dielectric, and semiconductor materials.

4. The optical transmitter according to claim 1, comprising a light absorption region for absorbing filter cutoff light output from said filter cutoff light output port.

5. The optical transmitter according to claim 1, comprising a temperature control device capable of controlling the temperature of said directly modulated laser and/or said wavelength filter.

6. The optical transmitter according to claim 1, further comprising:
   a monitor photodetector for detecting filter cutoff light output from said filter cutoff light output port; and
   a control circuit for controlling said directly modulated laser based on the power of filter cutoff light detected by said monitor photodetector.

7. The optical transmitter according to claim 5, further comprising:
   a monitor photodetector for detecting filter cutoff light output from said filter cutoff light output port; and
   a control circuit for controlling said temperature control device based on the power of filter cutoff light detected by said monitor photodetector.

8. The optical transmitter according to claim 1, wherein said wavelength filter is composed such that the change rate of the intensity of said filter transmitted light with respect to the wavelength is in a range of 100 dB/nm to 300 dB/nm at a wavelength at which the intensity of said filter transmitted light falls by 3 dB.

* * * * *